(12) United States Patent
Lee et al.

(10) Patent No.: US 11,868,650 B2
(45) Date of Patent: Jan. 9, 2024

(54) APPARATUS WITH COMBINATIONAL ACCESS MECHANISM AND METHODS FOR OPERATING THE SAME

(71) Applicant: Micron Technology, Inc., Boise, ID (US)

(72) Inventors: Hyun Yoo Lee, Boise, ID (US); Kang-Yong Kim, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 17/662,993

(22) Filed: May 11, 2022

(65) Prior Publication Data

US 2022/0269432 A1 Aug. 25, 2022

Related U.S. Application Data

(63) Continuation of application No. 17/022,551, filed on Sep. 16, 2020, now Pat. No. 11,360,695.

(51) Int. Cl.
*G06F 3/00* (2006.01)
*G06F 3/06* (2006.01)
(Continued)

(52) U.S. Cl.
CPC .......... *G06F 3/0655* (2013.01); *G06F 3/0604* (2013.01); *G06F 3/0679* (2013.01);
(Continued)

(58) Field of Classification Search
CPC ............. G06F 13/1663; G06F 13/1694; G06F 12/0215; G06F 3/061; G06F 3/0613; G06F 3/0679; G06F 11/1435; G06F 11/1441; G06F 11/1471; G06F 12/0638; G06F 12/0811; G06F 12/0824; G06F 12/0866; G06F 12/0871; G06F 12/0873; G06F 12/0893; G06F 12/12; G06F 12/16;
(Continued)

(56) References Cited

U.S. PATENT DOCUMENTS 9,697,874 B1 7/2017 Asnaashari et al.
10,573,368 B2 * 2/2020 Biswas ..................... G11C 5/06
(Continued)

FOREIGN PATENT DOCUMENTS

TW 201435589 A 9/2014
TW 201543498 A 11/2015

OTHER PUBLICATIONS

International Search Report and Written Opinion dated Dec. 16, 2021 for International Patent Application No. PCT/US2021/048379, 10 pages.

(Continued)

*Primary Examiner* — Thong Q Le
(74) *Attorney, Agent, or Firm* — Perkins Coie LLP

(57) ABSTRACT

Methods, apparatuses, and systems related to combining and utilizing multiple memory circuits having complementary characteristics are described. An apparatus may include a first memory circuit having a first emphasized characteristic and a second memory circuit having a second emphasized characteristic. The first and second memory circuits may be connected in parallel and to a common interface configured to communicate data between the apparatus and an external device.

20 Claims, 8 Drawing Sheets

(51) Int. Cl.
*G11C 11/406* (2006.01)
*G11C 11/408* (2006.01)
*G11C 11/4096* (2006.01)

(52) U.S. Cl.
CPC ........ *G11C 11/406* (2013.01); *G11C 11/4082* (2013.01); *G11C 11/4096* (2013.01); *G11C 2211/4062* (2013.01)

(58) Field of Classification Search
CPC .. G06F 13/1668; G06F 13/1673; G06F 13/22; G06F 13/28; G06F 13/4059; G06F 13/4234; G06F 2206/1014; G06F 2212/1024; G06F 2212/2022; G06F 2212/205; G06F 2212/654; G06F 2212/72; G06F 3/065; G06F 3/0661; G06F 3/0685; G06F 3/0689; G06F 30/327; G06F 30/392; G06F 9/44557; G11C 11/4091; G11C 5/025; G11C 11/4096; G11C 11/4087; G11C 11/221; G11C 11/2253; G11C 11/2273; G11C 2029/0411; G11C 29/52; G11C 29/74; G11C 29/802; G11C 29/806; G11C 11/4097; G11C 13/0069; G11C 13/0023; G11C 7/08; G11C 7/1063; G11C 7/109; G11C 7/12; G11C 13/0002; G11C 2029/0409; G11C 16/06; G11C 2013/0073; G11C 13/0007; G11C 13/0061; G11C 2207/002; G11C 2213/78; G11C 7/04; G11C 11/2255; G11C 11/2259; G11C 11/2297; G11C 11/4074; G11C 11/4094; G11C 29/76; G11C 5/066; G11C 5/147; G11C 7/10; G11C 7/1069; G11C 7/1096; G11C 8/08; G11C 8/10; G11C 11/4093; G11C 13/0033; G11C 13/0097; G11C 2213/71; G11C 2213/75; G11C 2213/79; G11C 7/1006; G11C 11/404; G11C 11/40618; G11C 11/4076; G11C 13/0026; G11C 13/0028; G11C 13/004; G11C 2207/005; G11C 2207/2236; G11C 7/00; G11C 7/02; G11C 7/1048; G11C 7/1051; G11C 7/22; G11C 11/4023; G11C 11/403; G11C 11/40607; G11C 11/5621; G11C 13/0035; G11C 16/02; G11C 16/0483; G11C 2013/0083; G11C 2207/105; G11C 2207/108; G11C 2207/2245; G11C 2211/4013; G11C 2213/77; G11C 5/04; G11C 5/06; G11C 5/063; G11C 7/06; G11C 7/065; G11C 7/1072
See application file for complete search history.

(56) References Cited

U.S. PATENT DOCUMENTS

| | | |
|---|---|---|
| 2002/0054504 A1 | 5/2002 | Micheloni et al. |
| 2005/0108492 A1 | 5/2005 | Zsohar |
| 2006/0031565 A1 | 2/2006 | Iyer et al. |
| 2007/0040271 A1 | 2/2007 | Jaurimo et al. |
| 2015/0199128 A1 | 7/2015 | Park et al. |
| 2017/0068633 A1 | 3/2017 | Kwon |
| 2018/0285253 A1 | 10/2018 | Chang et al. |
| 2020/0125290 A1 | 4/2020 | Shah et al. |

OTHER PUBLICATIONS

Office Action and Search Report dated Sep. 19, 2022 for Taiwanese Patent Application No. 110130863, 15 pages (with translation).

* cited by examiner

APPARATUS WITH COMBINATIONAL ACCESS MECHANISM AND METHODS FOR OPERATING THE SAME

CROSS-REFERENCE TO RELATED APPLICATION(S)

This application is a continuation of U.S. patent application Ser. No. 17/022,551, filed Sep. 16, 2020, now U.S. Pat. No. 11,360,695, which is incorporated herein by reference in its entirety.

TECHNICAL FIELD

The disclosed embodiments relate to devices, and, in particular, to semiconductor memory devices with access control mechanisms and methods for operating the same.

BACKGROUND

An apparatus (e.g., a processor, a memory system, and/or other electronic apparatus) can include one or more semiconductor circuits configured to store and/or process information. For example, the apparatus can include a memory device, such as a volatile memory device, a non-volatile memory device, or a combination device. Memory devices, such as dynamic random-access memory (DRAM), utilize electro-magnetic energy to store and access data.

Technological improvements are often associated with increasing the operating speed and/or decreasing the size/footprint of the apparatus and/or circuits therein. For memory devices, the improvements can be achieved by increasing the density of the memory circuit. However, increasing the density may provide increasing challenges for managing power, performance, and/or error.

DETAILED DESCRIPTION

As described in greater detail below, the technology disclosed herein relates to an apparatus, such as for memory systems, systems with memory devices, related methods, etc., for controlling access to signals. The apparatus (e.g., a memory device and/or a system including the memory device) can include different types of memory circuits (e.g., memory arrays) within one packaging/device unit (e.g., within a multi-die package or within a memory module). In some embodiments, a DRAM device (e.g., a DRAM package or a DRAM module) may include (1) one or more semiconductor dies or chips having lower memory storage density and higher performance (Low Density-High Performance (LD-HP) memory) and (2) one or more semiconductor dies or chips having higher memory storage density and lower performance (High Density-Low Performance (HD-LP) memory). As an example, the higher performance can correspond to shorter refresh intervals associated with Error Correction Code (ECC), shorter command-response times, faster synchronization times, and/or higher power consumption levels.

The apparatus can interact with a memory controller and/or a host device (e.g., a processor implementing an operating system) and store different types of data into the different types of memory circuits. For example, the DRAM can store data associated with higher Quality of Service (QoS) parameters in the LD-HP memory. The apparatus can provide a common/identical interface for the different types of memory circuits for the memory controller and/or the host device. For example, the DRAM can have data connections (e.g., DQ pads) and/or address connections (e.g., column address (CA) pads) connected in parallel. The DRAM can control the access between the dies LD-HP memory and the HD-LP memory using chip select (CS) signals. Accordingly, the apparatus can reduce power consumption (via, e.g., reducing refresh power for data associated with lower QoS values) while providing quicker access (via, e.g., scheduling earlier read operations for corresponding address) to data associated with higher QoS values.

In some embodiments, the apparatus can be configured to simultaneously initiate data operations (e.g., read and/or write operations) for the different types of memory circuits. The different performance levels can complete the operations at different times for the different circuits. Accordingly, the apparatus can further improve overall performance speeds by simultaneously initiating data operations while preventing the outputs from interfering with each other.

Figure 1:
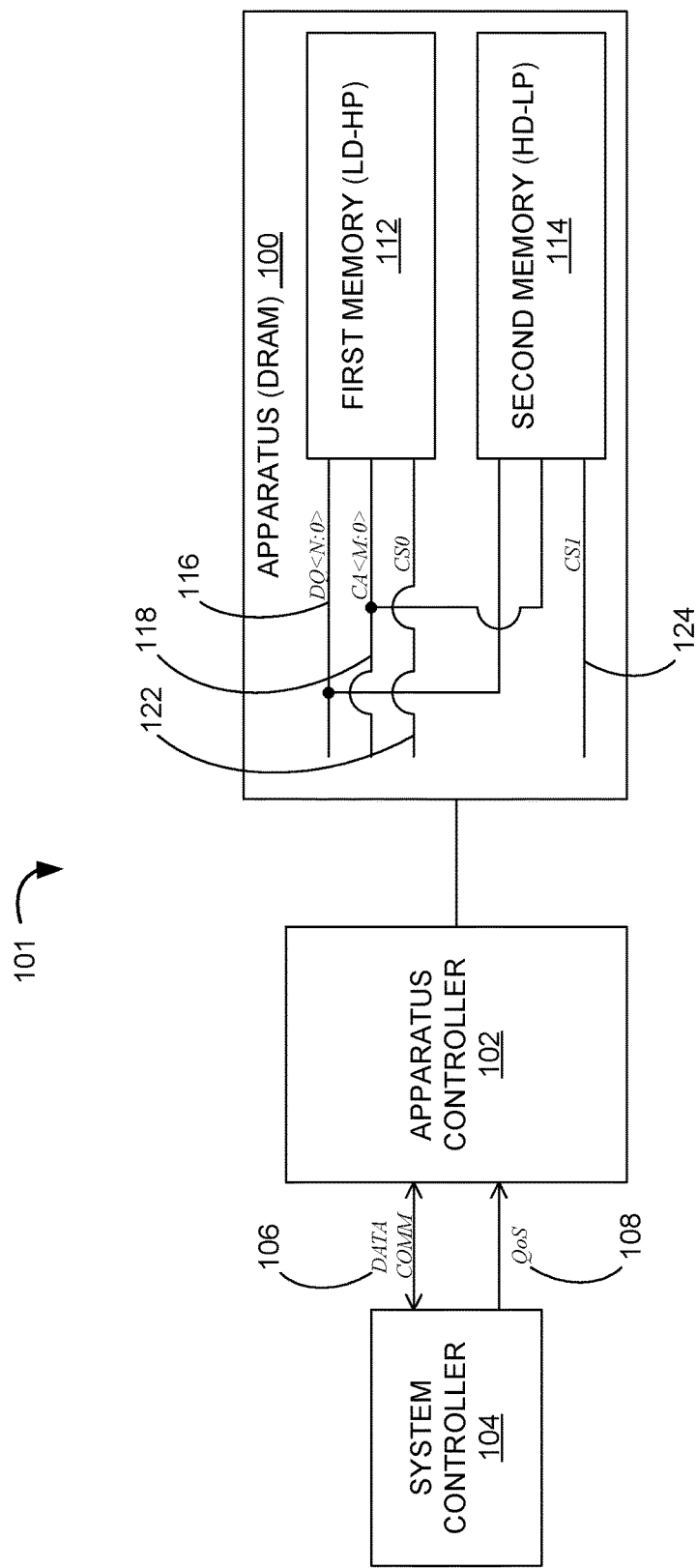
FIG. 1 illustrates an example environment in which an apparatus may operate in accordance with an embodiment of the present technology.

FIG. 1 is an illustration of an example environment 101 in which an apparatus 100 may operate in accordance with an embodiment of the present technology. The apparatus 100 can include a memory device or system, such as a volatile memory, a non-volatile memory, or a combination device/system. For example, the apparatus 100 can include a DRAM.

The apparatus 100 can be electrically coupled to an apparatus controller 102 and a system controller 104 (e.g., a set of processors). Some example operating environments can include a computing system having a central processing unit (CPU) as the system controller 104 interacting with a memory controller (e.g., the apparatus controller 102) to write data to and read data from a DRAM (e.g., the apparatus 100). The system controller 104 can function according to an operating system and send operational communications 106 (e.g., read/write commands, write data, addresses, etc.) to the memory controller. The apparatus 100 can also send read data back to the system controller 104 as the operational communications 106. Along with the operational communication 106, the CPU can send a priority indication 108 (e.g., a Quality of Service (QoS) value) associated with the commanded data operation. The priority indication 108 can correspond to preferences or requirements for data access speeds, data access frequencies, and/or data accuracies associated with the commanded operation and/or the associated data. The apparatus controller 102 can manage the flow of the data to or from the apparatus 100 according to the address and/or the priority indication 108.

The apparatus 100 can include within one device (e.g., within one package or on a common substrate) multiple memory units (e.g., chips of dies) having different types or characteristics. For example, the apparatus 100 can include a first memory 112 and a second memory 114 having different densities and/or performance levels. The first memory 112 can be a LD-HP memory array, and the second memory 114 can be a HD-LP memory array.

The first memory 112 and the second memory 114 can be configured to share a common interface associated with the operational communications 106. For example, data connections 116 (e.g., DQ pads) of the first memory 112 and the second memory 114 can be connected in parallel. Also, address connections 118 (e.g., CA pads) can of the first memory 112 and the second memory 114 can be connected in parallel. The first memory 112 and the second memory 114 can be accessed according to a first CS connection 122 and a second CS connection 124, respectively, that correspond to the priority indication 108. For example, the apparatus controller 102 can generate the CS signal according to the priority indication 108. The apparatus 100 can be configured to map the CS signal according to the different types or characteristics.

Accordingly, the apparatus controller 102 and/or the system controller 104 can be agnostic or blind to the internal separations/managements of the first memory 112 and the second memory 114. In other words, devices outside of the apparatus 100 can use a common interface to take advantage of the different characteristics without accounting for or managing the different types of circuits used to provide the different characteristics.

As an illustrative example, the environment 101 can correspond to a computing device, such as a computer, a server, a smart phone, a wearable device, etc. The system controller 104 can be a processor or a CPU, the apparatus controller 102 can be a memory controller, and the apparatus 100 can be a DRAM. The CPU can function according to an operating system and send/receive the operational communications 106 (e.g., read/write commands, read/write data, address, etc.) to the memory controller. Along with the operational communication 106, the CPU can send the priority indication 108 (e.g., a Quality of Service (QoS) value) associated with the commanded data operation. The priority indication 108 can correspond to preferences or requirements for data access speeds, data access frequencies, and/or data accuracies. The memory controller can manage the flow of the data (e.g., the read/write data) to the apparatus 100 according to the address and/or the priority indication 108. For read and/or write operations, the memory controller can generate the CS signal according to the QoS indicator. The DRAM can include one or more LD-HP dies and one or more HD-LP dies that correspond to the CS signals and the QoS indicators.

Figure 2:
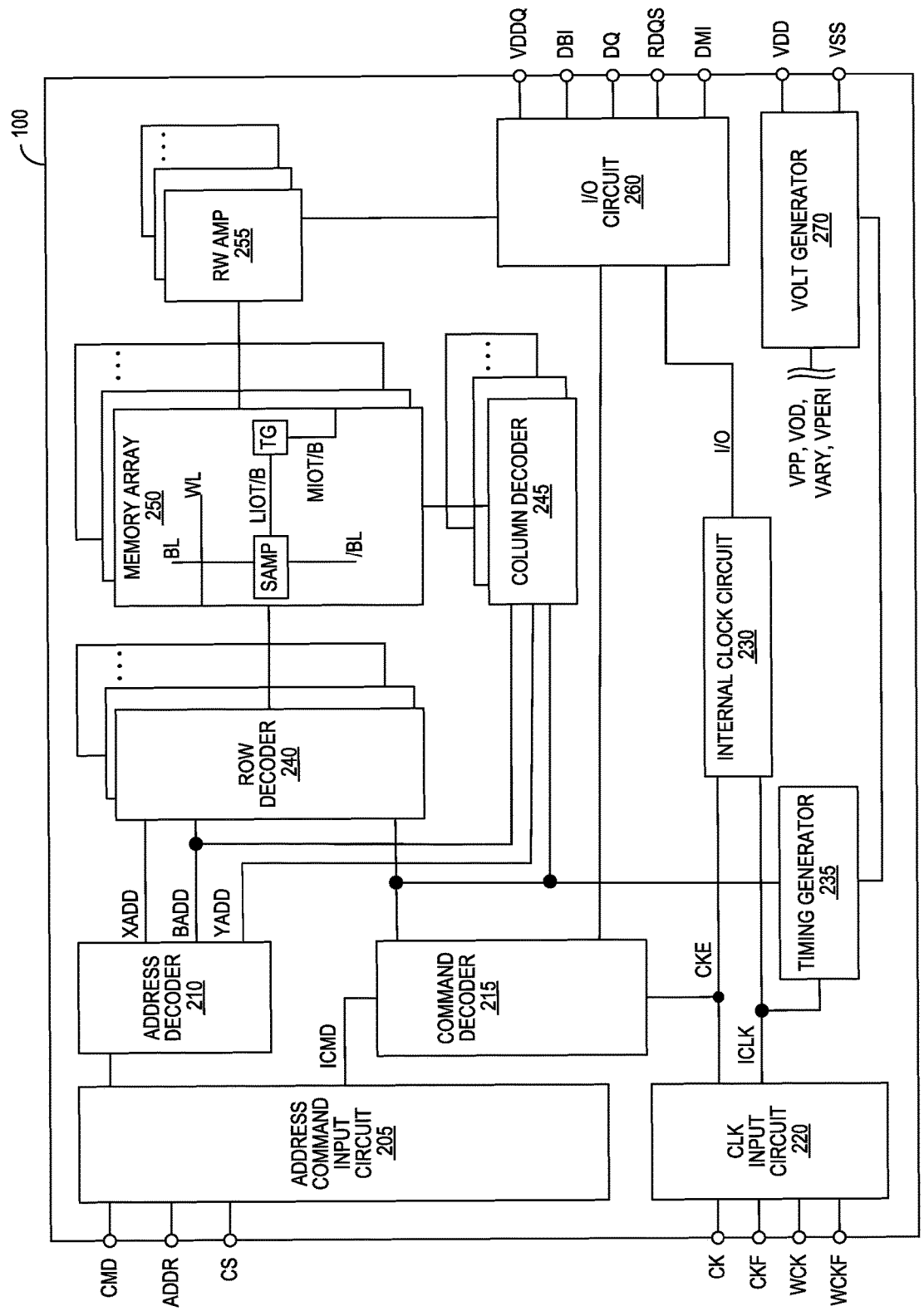
FIG. 2 illustrates a block diagram of the apparatus in accordance with an embodiment of the present technology.

FIG. 2 is a block diagram of the apparatus 100 (e.g., a semiconductor die assembly, including a three-dimensional integration (3DI) device or a die-stacked package) in accordance with an embodiment of the present technology. For example, the apparatus 100 can include a DRAM or a portion thereof that includes one or more dies/chips.

The apparatus 100 may include an array of memory cells, such as memory array 250. The memory array 250 may include a plurality of banks (e.g., banks 0-15), and each bank may include a plurality of word-lines (WL), a plurality of bit lines (BL), and a plurality of memory cells arranged at intersections of the word-lines and the bit lines. Memory cells can include any one of a number of different memory media types, including capacitive, magnetoresistive, ferroelectric, phase change, or the like. The selection of a word-line WL may be performed by a row decoder 240, and the selection of a bit line BL may be performed by a column decoder 245. Sense amplifiers (SAMP) may be provided for corresponding bit lines BL and connected to at least one respective local I/O line pair (LIOT/B), which may in turn be coupled to at least respective one main I/O line pair (MIOT/B), via transfer gates (TG), which can function as switches. The sense amplifiers and transfer gates may be operated based on control signals from decoder circuitry, which may include the command decoder 215, the row decoders 240, the column decoders 245, any control circuitry of the memory array 250, or any combination thereof. The memory array 250 may also include plate lines and corresponding circuitry for managing their operation.

The apparatus 100 may employ a plurality of external terminals that include command and address terminals coupled to a command bus and an address bus to receive command signals (CMD) and address signals (ADDR), respectively. The apparatus 100 may further include a chip select terminal to receive a chip select signal (CS), clock terminals to receive clock signals CK and CKF, data clock terminals to receive data clock signals WCK and WCKF, data terminals DQ, RDQS, DBI, and DMI, power supply terminals VDD, VSS, and VDDQ.

The command terminals and address terminals may be supplied with an address signal and a bank address signal (not shown in FIG. 2) from outside. The address signal and the bank address signal supplied to the address terminals can be transferred, via a command/address input circuit 205, to an address decoder 210. The address decoder 210 can receive the address signals and supply a decoded row address signal (XADD) to the row decoder 240, and a decoded column address signal (YADD) to the column decoder 245. The address decoder 210 can also receive the bank address signal and supply the bank address signal to both the row decoder 240 and the column decoder 245.

The command and address terminals may be supplied with command signals (CMD), address signals (ADDR), and chip select signals (CS), from a memory controller. The command signals may represent various memory commands from the memory controller (e.g., including access commands, which can include read commands and write commands). The chip select signal may be used to select the apparatus 100 to respond to commands and addresses provided to the command and address terminals. When an active chip select signal is provided to the apparatus 100, the commands and addresses can be decoded, and memory operations can be performed. The command signals may be provided as internal command signals ICMD to a command decoder 215 via the command/address input circuit 205. The command decoder 215 may include circuits to decode the internal command signals ICMD to generate various internal signals and commands for performing memory operations, for example, a row command signal to select a word-line and a column command signal to select a bit line. The command decoder 215 may further include one or more registers for tracking various counts or values (e.g., counts of refresh commands received by the apparatus 100 or self-refresh operations performed by the apparatus 100).

Read data can be read from memory cells in the memory array 250 designated by row address (e.g., address provided with an active command) and column address (e.g., address provided with the read). The read command may be received by the command decoder 215, which can provide internal commands to input/output (I/O) circuit 260 so that read data can be output from the data terminals DQ, RDQS, DBI, and DMI via read/write amplifiers 255 and the I/O circuit 260 according to the RDQS clock signals. The read data may be provided at a time defined by read latency information RL that can be programmed in the apparatus 100, for example, in a mode register (not shown in FIG. 2). The read latency information RL can be defined in terms of clock cycles of the CK clock signal. For example, the read latency information RL can be a number of clock cycles of the CK signal after the read command is received by the apparatus 100 when the associated read data is provided.

Write data can be supplied to the data terminals DQ, DBI, and DMI according to the WCK and WCKF clock signals. The write command may be received by the command decoder 215, which can provide internal commands to the I/O circuit 260 so that the write data can be received by data receivers in the I/O circuit 260 and supplied via the I/O circuit 260 and the read/write amplifiers 255 to the memory array 250. The write data may be written in the memory cell designated by the row address and the column address. The write data may be provided to the data terminals at a time that is defined by write latency WL information. The write latency WL information can be programmed in the apparatus 100, for example, in the mode register. The write latency WL information can be defined in terms of clock cycles of the CK clock signal. For example, the write latency information WL can be a number of clock cycles of the CK signal after the write command is received by the apparatus 100 when the associated write data is received.

The power supply terminals may be supplied with power supply potentials $V_{DD}$ and $V_{SS}$. These power supply potentials $V_{DD}$ and $V_{SS}$ can be supplied to an internal voltage generator circuit 270. The internal voltage generator circuit 270 can generate various internal potentials $V_{PP}$, $V_{OD}$, $V_{ARY}$, $V_{PERI}$, and the like based on the power supply potentials $V_{DD}$ and $V_{SS}$. The internal potential $V_{PP}$ can be used in the row decoder 240, the internal potentials $V_{OD}$ and $V_{ARY}$ can be used in the sense amplifiers included in the memory array 250, and the internal potential $V_{PERI}$ can be used in many other circuit blocks.

The power supply terminal may also be supplied with power supply potential $V_{DDQ}$. The power supply potential $V_{DDQ}$ can be supplied to the I/O circuit 260 together with the power supply potential VSS. The power supply potential $V_{DDQ}$ can be the same potential as the power supply potential $V_{SS}$ in an embodiment of the present technology. The power supply potential $V_{DDQ}$ can be a different potential from the power supply potential $V_{DD}$ in another embodiment of the present technology. However, the dedicated power supply potential $V_{DDQ}$ can be used for the I/O circuit 260 so that power supply noise generated by the I/O circuit 260 does not propagate to the other circuit blocks.

The clock terminals and data clock terminals may be supplied with external clock signals and complementary external clock signals. The external clock signals CK, CKF, WCK, WCKF can be supplied to a clock input circuit 220. The CK and CKF signals can be complementary, and the WCK and WCKF signals can also be complementary. Complementary clock signals can have opposite clock levels and transition between the opposite clock levels at the same time. For example, when a clock signal is at a low clock level a complementary clock signal is at a high level, and when the clock signal is at a high clock level the complementary clock signal is at a low clock level. Moreover, when the clock signal transitions from the low clock level to the high clock level the complementary clock signal transitions from the high clock level to the low clock level, and when the clock signal transitions from the high clock level to the low clock level the complementary clock signal transitions from the low clock level to the high clock level.

Input buffers included in the clock input circuit 220 can receive the external clock signals. For example, when enabled by a clock/enable signal from the command decoder 215, an input buffer can receive the clock/enable signals. The clock input circuit 220 can receive the external clock signals to generate internal clock signals ICLK. The internal clock signals ICLK can be supplied to an internal clock circuit 230. The internal clock circuit 230 can provide various phase and frequency controlled internal clock signals based on the received internal clock signals ICLK and a clock enable (not shown in FIG. 2) from the command/address input circuit 205. For example, the internal clock circuit 230 can include a clock path (not shown in FIG. 2) that receives the internal clock signal ICLK and provides various clock signals to the command decoder 215. The internal clock circuit 230 can further provide I/O clock signals. The I/O clock signals can be supplied to the input/output circuit 260 and can be used as timing signals for determining output timing of read data and/or input timing of write data. The I/O clock signals can be provided at multiple clock frequencies so that data can be output from and input to the apparatus 100 at different data rates. A higher clock frequency may be desirable when high memory speed is desired. A lower clock frequency may be desirable when lower power consumption is desired. The internal clock signals ICLK can also be supplied to a timing generator 235 and thus various internal clock signals can be generated.

The apparatus 100 can be connected to any one of a number of electronic devices capable of utilizing memory for the temporary or persistent storage of information, or a component thereof. For example, a host device (e.g., the system controller 104 of FIG. 1) of apparatus 100 may be a computing device such as a desktop or portable computer, a server, a hand-held device (e.g., a mobile phone, a tablet, a digital reader, a digital media player), or some component thereof (e.g., a central processing unit, a co-processor, a dedicated memory controller, etc.). The host device may be a networking device (e.g., a switch, a router, etc.) or a recorder of digital images, audio and/or video, a vehicle, an appliance, a toy, or any one of a number of other products. In one embodiment, the host device may be connected directly to apparatus 100; although in other embodiments, the host device may be indirectly connected to memory device (e.g., over a networked connection or through intermediary devices).

Figure 3A:
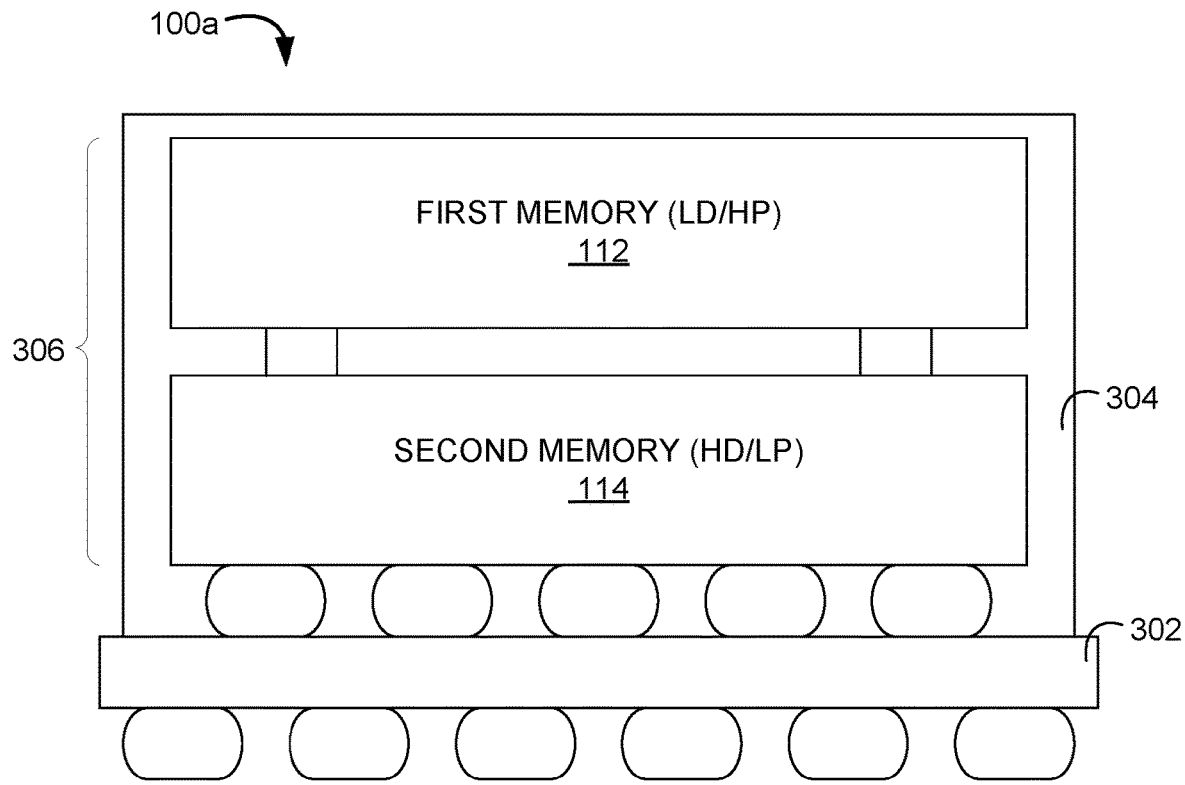
FIG. 3A illustrates a cross-sectional view of a first example packaging of the apparatus of FIG. 2 in accordance with an embodiment of the present technology.

The apparatus 100 of FIG. 2 can have different packaging formats. FIG. 3A is a cross-sectional view illustrating a first example packaging 100a of the apparatus 100 of FIG. 2 in accordance with an embodiment of the present technology. The first example packaging 100a can correspond to a multi-die package. In some embodiments, the first memory 112 and the second memory 114 can each be implemented as a semiconductor die. The first memory 112 and the second memory 114 can be attached over a substrate 302 (e.g., a printed circuit board (PCB), a silicon substrate, a ceramic structure, a metallic structure, etc.). For example, the dies can be attached over each other to form a die stack. 306. Alternatively, the dies can be attached across a lateral direction and be separated by a lateral distance.

The dies can be electrically coupled to each other and/or facilitate connections between the dies and the substrate 302. For example, the first memory 112 and the second memory 114 can be electrically coupled to each other through connectors, bumps, pads, wire bonds, and the like. Also, the dies can include Through Silicon Vias (TSVs) configured to provide electrical coupling through a silicon substrate of the corresponding die.

The first memory 112 and the second memory 114 can be encased in an encapsulant 304 (e.g., resin material) that isolates the dies from external environment. Accordingly, the substrate 302 can provide an external interface (via, e.g., wiring, traces, pads, contacts, solder bumps, etc.) for both the first memory 112 and the second memory 114.

Figure 3B:
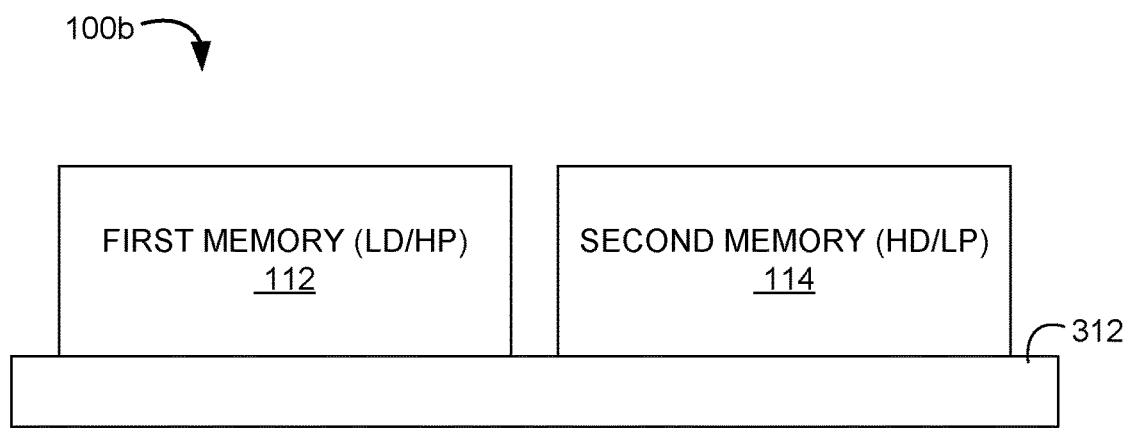
FIG. 3B illustrates a cross-sectional view of a second example packaging of the apparatus of FIG. 2 in accordance with an embodiment of the present technology.

As another example packaging format, FIG. 3B is a cross-sectional view illustrating a second example packaging 100b of the apparatus 100 of FIG. 2 in accordance with an embodiment of the present technology. The second example packaging 100b can correspond to a multi-die module, such as a memory module. As with the first example packaging 100a, the first memory 112 and the second memory 114 can each be implemented as a semiconductor die. The first memory 112 and the second memory 114 can be attached over a substrate 312 (e.g., a printed circuit board (PCB), a silicon substrate, a ceramic structure, etc.) across a lateral direction and be separated by a lateral distance. The substrate 312 can be configured to provide an external interface for both the first memory 112 and the second memory 114. The first memory 112 and the second memory 114 can be encased or be exposed.

Figure 4:
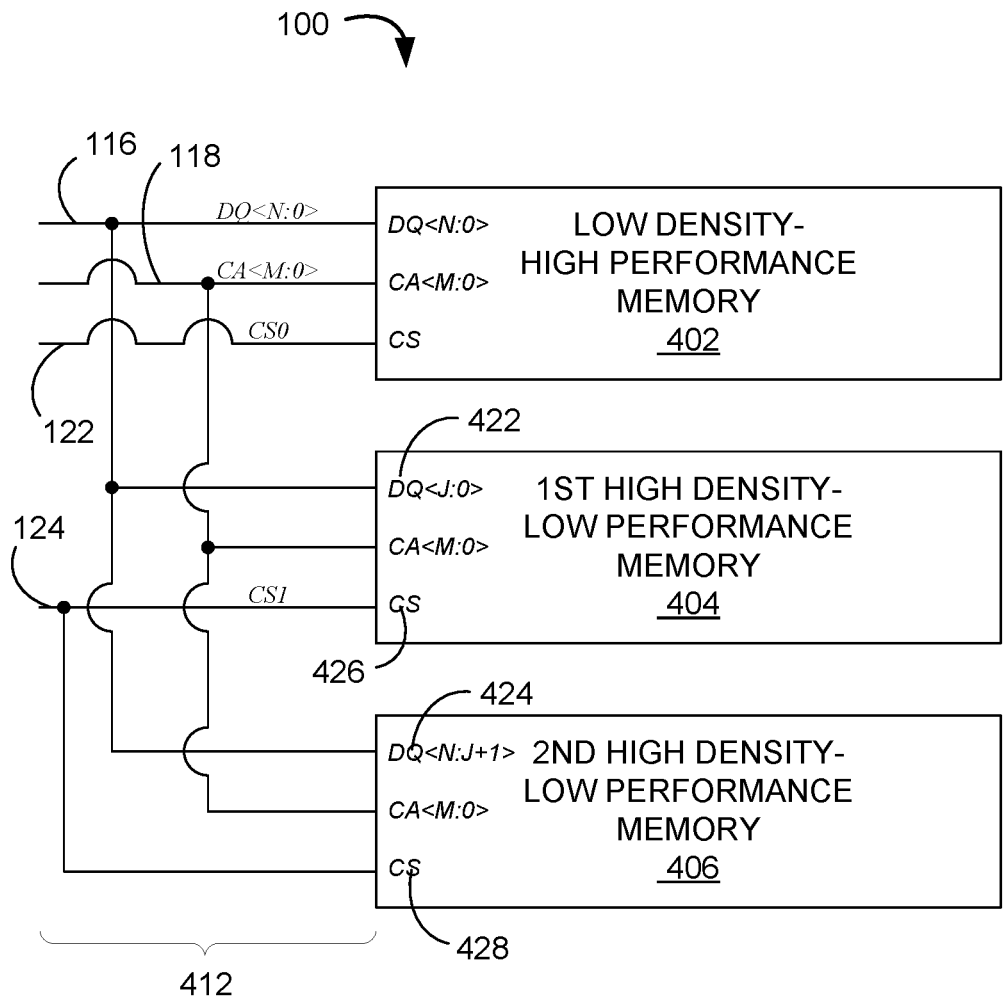
FIG. 4 illustrates a detailed example of the apparatus in accordance with an embodiment of the present technology.

FIG. 4 is a detailed example of the apparatus in accordance with an embodiment of the present technology. In some embodiments, the apparatus 100 can include one or more LD-HP memories 402 (each corresponding to, e.g., the first memory 112 of FIG. 1), a first HD-LP memory 404, and/or a second HD-LP memory 406 (each corresponding to, e.g., the second memory 114 of FIG. 1) within a single device unit/package as described above. The LD-HP memory 402 can be a semiconductor chip that includes memory cells in lower density (e.g., with respect to the number of cells for a given set of support circuitry and/or packaging) relative to the HD-LP memories 404 and 406. The LD-HP memory 402, relative to the HD-LP memories 404 and 406, can be configured to provide relatively higher performance, such as with respect to refresh intervals associated with ECC operations (e.g., data update/correction), shorter command-response times, faster synchronization times, and/or higher power consumption levels. For example, the LD-HP memory 402 can be configured to have faster (e.g., relative to HD-LP memories 404 and 406 or according to a pre-existing classification) synchronization timing parameters, such as time internal read to first data ($t_{AA}$), time active to precharge (e.g., ACT to PRE; $t_{RCD}$), time precharge (e.g., a recovery period; $t_{RP}$), time refresh command ($t_{RFC}$), and the like.

In some embodiments, the LD-HP memory 402 can be a Low Power Double Data Rate 5 (LP-DDR5) DRAM device and the HD-LP memories 404 and 406 can each be a memory device (e.g., a hybrid memory) that implements at least one interface protocol and/or at least one data-storage technology (e.g., magnetic storage media, phase-change storage media, ferroelectric storage media, etc.) different from the LD-HP memory 402 (e.g., capacitive storage media). The LP-DDR5 and the hybrid memory can be combined as different ranks within the apparatus 100. The hybrid memory can be configured to operate with less memory refresh than the LP-DDR5 and/or without any memory refresh operations. Alternatively, the LD-HP memory 402 can be a lower density LP-DDR5 device with 'X' bit correction mechanism (e.g., 1-bit ECC configuration), and the HD-LP memories 404 and 406 can be higher density LP-DDR5 devices with 'Y' bit correction mechanism (e.g., 3-bit ECC configuration), where Y>X. Accordingly, the lower density device can provide faster core access time than the higher density devices. The refresh interval time of the higher density devices can be greater than (e.g., more than double) the lower density device. Alternatively, the different memories within the apparatus 100 can include other types of memories, such as emerging memory, that have complementary characteristics.

The LD-HP memories 402 and/or the HD-LP memories 404/406/etc. can be electrically coupled to each other with a common interface 412. The common interface 412 can include the data connections 116 and the address connections 118 that are shared across the LD-HP memories 402 and the HD-LP memories 404/406/etc. For example, the data connections 116 can include a data bus (DQ<N:0>) and that electrically connects the categorically different dies in parallel. Also, the address connections 118 can include an address bus (e.g., a column address (CA) bus) that electrically connects the categorically different dies in parallel.

As illustrated in FIG. 4, the data ports DQ<N:0> of the LD-HP memory 402 can be connected in parallel to the data ports of the HD-LP memories 404 and 406; the column address ports CA<M:0> of the dies can be connected in parallel. In some embodiments, the first HD-LP memory 404 and the second HD-LP memory 406 can be configured to each store/provide a unique portion of a unit of data. In other words, the first HD-LP memory 404 and the HD-LP memory 406 as a single group/unit for each write/read data intended for the group. For example, the first HD-LP memory 404 can be configured to store and provide access to a first portion (e.g., bits J:0) of a data unit (e.g., a word), and the second HD-LP memory 406 can be configured to store and provide access to a second portion (e.g., bits N:J+1) of the data unit. Accordingly, the first HD-LP memory 404 can include a first set of data ports 422 (e.g., DQ<J:0>), and the second HD-LP memory 406 can include a second set of data ports 424 (e.g., DQ<N:J+1>). The first set of data ports 422 can be connected to a corresponding set of the DQ connections of the LD-HP memory 402. The second set of data ports 424 can be connected to a different set of the DQ connections of the LD-HP memory 402.

Based on the shared/parallel connections, the apparatus controller 102 of FIG. 1 and/or the system controller 104 of FIG. 1 can simultaneously send write data to the LD-HP memory 402 and the HD-LP memories 404 and 406 over the data connections 116. Also, the apparatus controller 102 and/or the system controller 104 can simultaneously send write address to the LD-HP memory 402 and the HD-LP memories 404 and 406. In reading/writing data, the apparatus 100 can be configured to select the memory grouping and the corresponding advantages using the different CS connections 122 and 124. When a group of dies are configured to operate as a single unit of storage (e.g., the first HD-LP memory 404 and the second HD-LP memory 406 as described above), the CS ports can be connected to each other. For example, a first CS port 426 of the first HD-LP memory 404 can be tied to a second CS port 428 of the second HD-LP memory 408 and the second CS connection 124. Accordingly, both the first HD-LP memory 404 and the second HD-LP memory 408 can be selected simultaneously with a single corresponding CS signal (CS1) sent over the second CS connection 124.

For read operations, the CS signal can specify a source of the data as the LD-HP memory 402 or the set of HD-LP memories 406 and 408. The apparatus 100 can access the storage location corresponding to the CA within the selected chip(s) and provide the read data onto the data connections 116. Accordingly, the read data can be communicated back to apparatus controller 102 and the system controller 104.

In some embodiments, the apparatus 100 and/or the apparatus controller 102 can be configured to store or duplicate the same data across the LD-HP memory 402 and the set of HD-LP memories 406 and 408. The apparatus 100 and/or the apparatus controller 102 can select the source of the data according to an urgency associated with the request. In some embodiments, the apparatus 100 can include a set of different or non-matching types of dies that provide the low-density and high-performance and/or a set of different or non-matching types of dies that provide the high-density and low-performance.

As an illustrative example, some memory devices can be configured to rely on ECC corrections to offset storage errors (caused by, e.g., row hammer events or charge dissipation over time) and retain or recover valid data. To further increase reliability in terms of data error, the memory devices can use additional (e.g., more than one) parity for the ECC. With ECC, the frequency and/or durations of data refreshes can be reduced based on the error correcting capacity. However, the ECC operation, especially with increasing number of parity bits, can degrade the performance (e.g., read response time) for the device. For memory devices that reduce or eliminate ECC corrections, more frequent and/or longer duration refresh operations can be used to maintain accurate charge levels, thereby maintaining valid/reliability of the stored data. Accordingly, power consumption grows due to the increased refresh frequency/ duration. The increased power consumption becomes further problematic as the memory density/functionalities increase. For devices with limited power (e.g., mobile and/or wearable devices), the increase in refresh power can reduce the operational capacity/duration of the overall system. Thus, demand exists for memory devices to provide high performance while maintaining data reliability and maintaining/ reducing power consumption.

By combining the LD-HP memory 402 and the HD-LP memory 404/406 into a single memory device (e.g., DRAM), the apparatus 100 can simultaneously provide the high performance (e.g., faster access via the LD-HP memory 402) and the data reliability (via, e.g., the refresh operations and/or the ECC operations) while providing a desired storage capacity. Moreover, the apparatus can provide reduced power consumption for the overall apparatus 100 by reducing a sum of the refresh and/or ECC operations performed for the storage capacity. The apparatus 100 can further reduce power consumption by reducing the average duration of the read/write cycles with the increased performance. Unlike conventional architecture (e.g., a combination of cache and RAM, a combination of volatile and non-volatile, etc.) that utilize different interfaces/protocol to combine the different types of memory, the apparatus 100 can use the common interface 412 and one corresponding protocol to leverage the benefits of the LD-HP memory 402 and the HD-LP memory 404/406. In other words, the apparatus controller 102 and the system controller 104 can be blind to the different architecture within the apparatus 100 and utilize a common protocol to access the desired characteristic/ benefit as needed.

Figure 5:
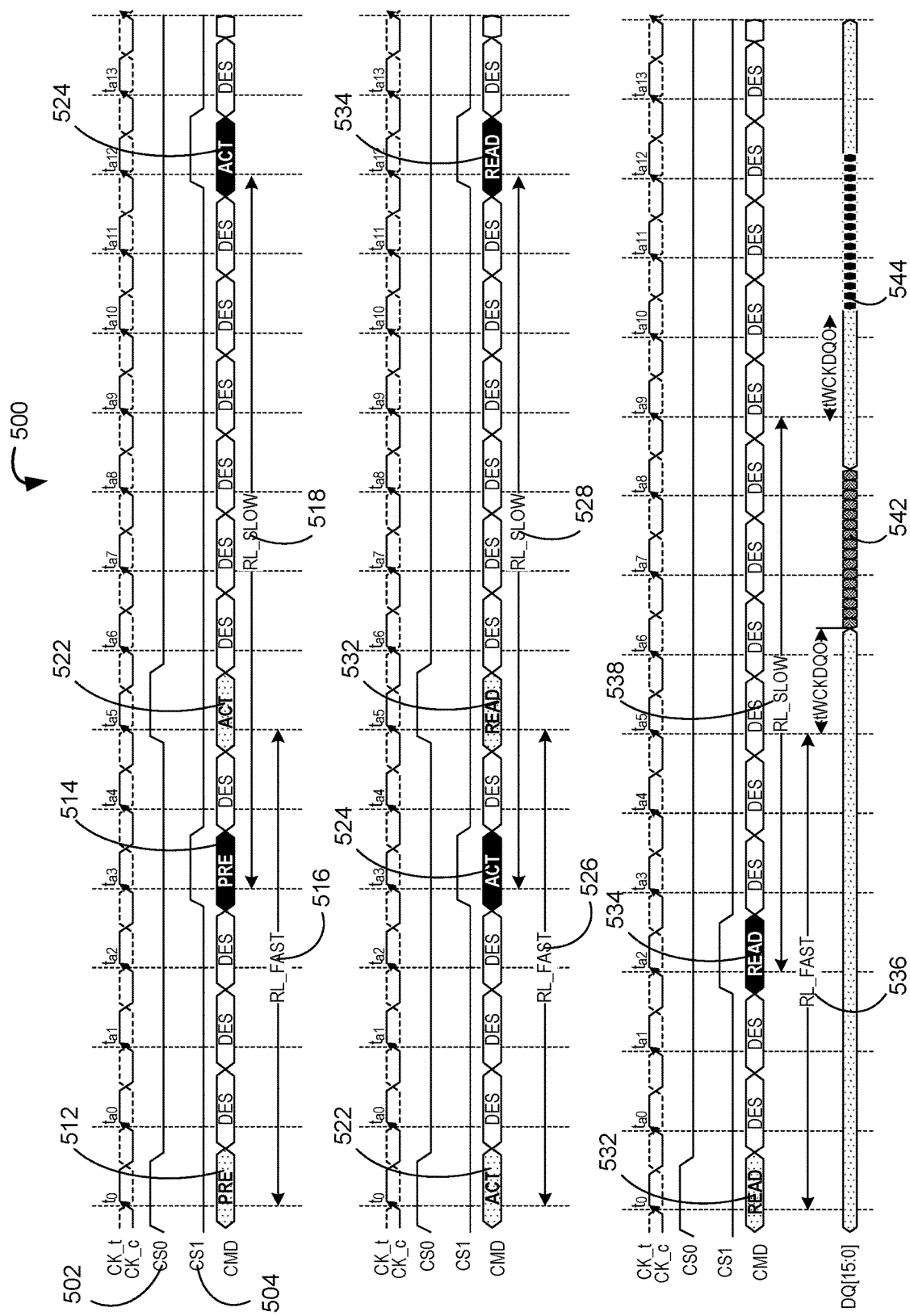
FIG. 5 illustrates example operational states of the different types of memories in the apparatus of FIG. 4 in accordance with an embodiment of the present technology.

FIG. 5 illustrates example operational states of the different types of memories (e.g., the LD-HP memory 402 of FIG. 4 and the HD-LP memories 404 and 406 of FIG. 4) in the apparatus 100 of FIG. 4 in accordance with an embodiment of the present technology. The operational states can be represented by a first timing diagram 500 that describes sets of actions associated with a read operation for the LD-HP memory 402 of FIG. 4 in comparison to a read operation for the HD-LP memory 404/406 of FIG. 4.

The first timing diagram 500 can illustrate example timings of a clock signal, a first CS signal 502, a second CS signal 504, and a command sequence. The command sequence can include a first precharge (PRE) command 512 concurrent with an active state of the first CS signal 502. Accordingly, the first PRE command 512 can be received by the LD-HP memory 402 for preparing or precharging necessary circuits therein for the read operation. The command sequence can further include a second PRE command 514 concurrent with an active state of the second CS signal 504. Accordingly, the second PRE command 514 can be received by the HD-LP memory 404/406 for preparing or precharging necessary circuits therein for the read operation.

The command sequence can include a first activate (ACT) command 522 that follows the first PRE command 512 after a first precharging delay 516 (e.g., a maximum duration for the LD-HP memory 402 to complete the precharging action). The first ACT command 522 can be concurrent with an active state of the first CS signal 502 to coordinate reception by the LD-HP memory 402. Similarly, the command sequence can include a second ACT command 524 that follows the second Pre command 514 after a second precharging delay 518 (e.g., a maximum duration for the HD-LP memory 404/406 to complete the precharging action). The second ACT command 524 can be concurrent with an active state of the second CS signal 504 to coordinate reception by the HD-LP memory 404/406. The LD-HP memory 402 can be configured to provide a faster response than the HD-LP memory 404/406, and the first precharging delay 516 can be shorter than the second precharging delay 518.

The command sequence can include a first read (READ) command 532 and a second read command 534 that follows the first ACT command 522 and the second ACT command 524, respectively. The first read command 532 can be accompanied by the active state of the first CS signal 502 for reception by the LD-HP memory 402, and the second read command 534 can be accompanied by the active state of the second CS signal 504 for reception by the HD-LP memory 404/406. The read commands 532 and 534 can be delayed by respective first activation delay 526 (e.g., a maximum duration for the LD-HP memory 402 to activate a circuit/bank for reading the data at the requested location) and second activation delay 528 (e.g., a maximum duration for the HD-LP memory 404/406 to activate a circuit/bank for reading the data at the requested location). The first activation delay 526 can be shorter than the second activation delay 528.

In response to the first read command 532, the LD-HP memory 402 can determine the data at the requested location and generate a first read output 542 accordingly. The first read output 542 can be delayed by a first read delay 536. The HD-LP memory 404/406 can determine data at the requested location in response to the second read command 534 and generate a second read output 544. The second read output 544 can be delayed by a second read delay 538. The first read delay 536 can be shorter than the second read delay 538. The first read output 542 and/or the second read output 544 can be delayed by an output processing delay ($t_{WCKDQO}$).

As described above, the LD-HP memory 402 can be configured to provide the first read output 542 faster than the HD-LP memory 404/406 providing the second read output 544. For example, in comparison to the HD-LP memory 404/406, the LD-HP memory 402 can include shorter data paths, faster clocks, faster switches, higher operating voltages, and the like that provide the faster output. Accordingly, a combination of the first precharging delay 516, the first activation delay 526, and/or the first read delay 536 can be shorter/less than a combination of the second precharging delay 518, the second activation delay 528, and/or the second read delay 538.

The various delays described above can be predetermined and known by the apparatus 100 of FIG. 1 and/or the apparatus controller 102 of FIG. 1. Accordingly, the apparatus controller 102 can schedule the read operations for the LD-HP memory 402 and the HD-LP memory 404/406 to overlap. In other words, at least portions of the PRE, ACT, and/or READ actions can occur concurrently across the LD-HP memory 402 and the HD-LP memory 404/406. In scheduling the parallel/concurrent read operations, the apparatus 100 and/or the apparatus controller 102 can rely on the known delays and the difference between the delays such that the first read output 542 and the second read output 544 are separated in time (i.e., do not overlap in time).

Figure 6:
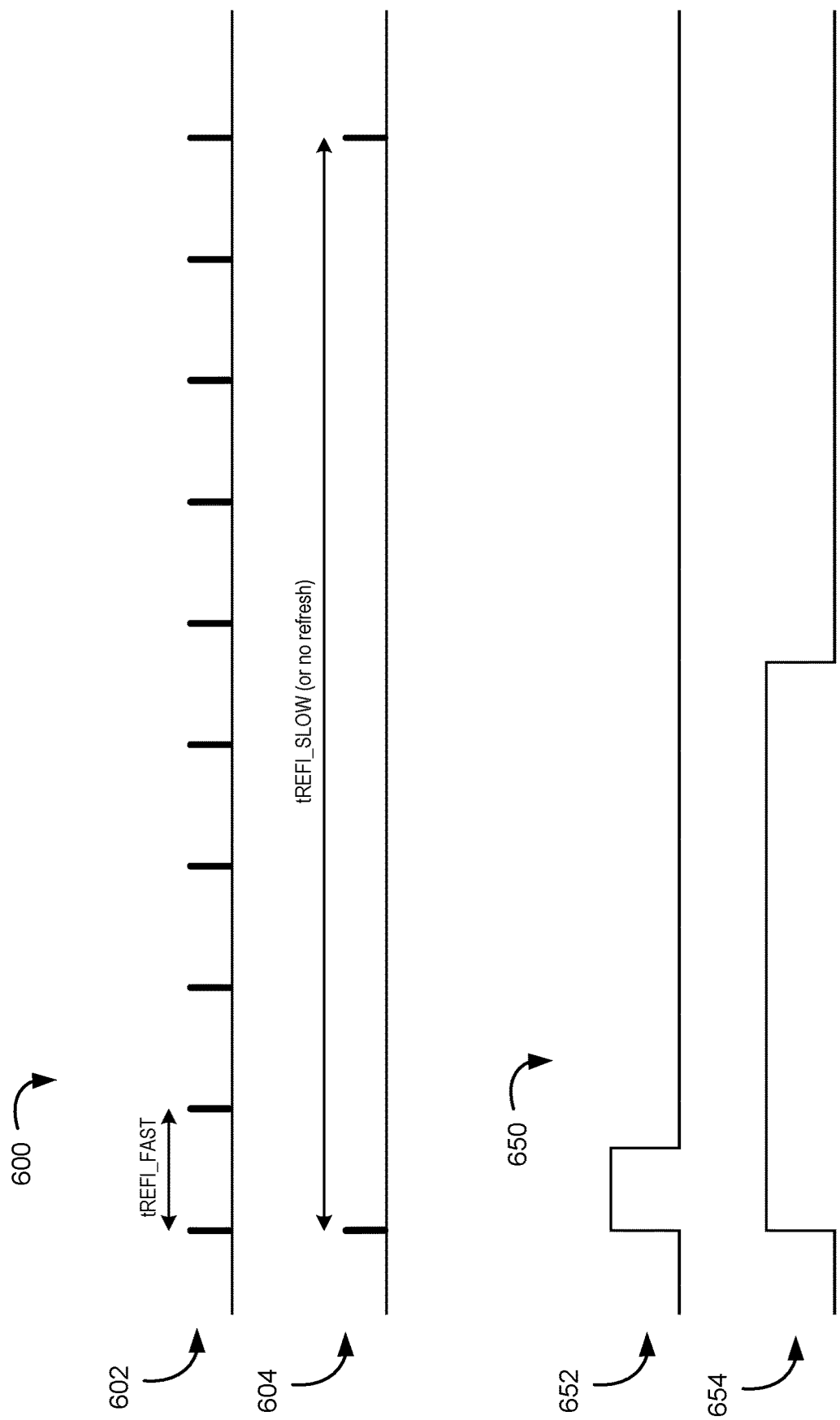
FIG. 6. illustrates complementary characteristics of the different types of memories in the apparatus of FIG. 4 in accordance with an embodiment of the present technology.

FIG. 6 illustrates example complementary characteristics of the different types of memories (e.g., the LD-HP memory 402 of FIG. 4 and the HD-LP memories 404 and 406 of FIG. 4) in the apparatus 100 of FIG. 4 in accordance with an embodiment of the present technology. For example, a second timing diagram 600 illustrates refresh frequencies for the different types of memories. As illustrated, a first refresh timing 602 for the LD-HP memory 402 can be more frequent in comparison to a second refresh timing 604 for the HD-LP memory 404/406. As an example, the first refresh timing 602 can represent Time Refresh Interval ($t_{REF1}$) of the LD-HP memory 402, and the second refresh timing 604 can represent $t_{REF1}$ of the HD-LP memory 404/406. The refresh timings can correspond to the ECC capacities/configurations of the memories. In some embodiments, such as for emerging memories, refresh operations may be eliminated. Accordingly, the HD-LP memory can provide the above-discussed power savings based on reducing the overall number of refresh operations for the apparatus 100.

Also, a third timing diagram 650 can illustrate refresh durations for the different types of memories. As illustrated, a first refresh duration 652 for the LD-HP memory 402 can be shorter than a second refresh duration 654 for the HD-LP memory 404/406. As an example, the first refresh duration 652 can represent Time Refresh Command ($t_{RFC}$) for the LD-HP memory 402, and the second refresh duration 654 can represent $t_{RFC}$ for the HD-LP memory 404/406. Accordingly, the LD-HP memory 402 can provide the above-discussed performance advantages (e.g., read response) by being able to access the stored data within a shorter amount of time in comparison to the HD-LP memory 404/406.

Figures 7A, 7B:
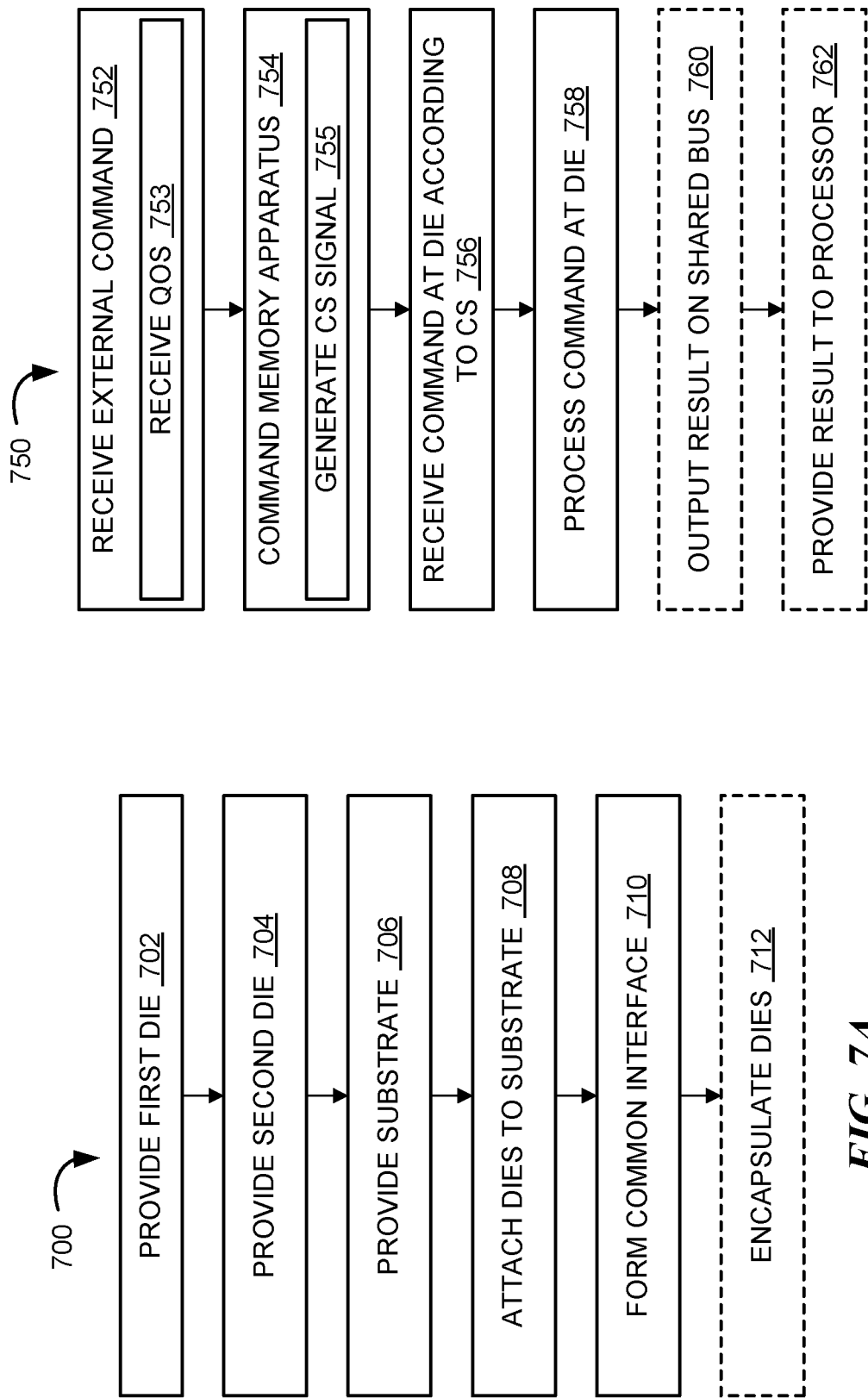
FIG. 7A is a flow diagram illustrating an example method of manufacturing an apparatus in accordance with an embodiment of the present technology.
FIG. 7B is a flow diagram illustrating an example method of operating an apparatus in accordance with an embodiment of the present technology.

FIG. 7A is a flow diagram illustrating an example method 700 of manufacturing an apparatus (e.g., the apparatus 100 of FIG. 1, such as the first example packaging 100a of FIG. 2A and/or the second example packaging 100b of FIG. 3B) in accordance with an embodiment of the present technology.

At block 702, a first die (e.g., the first memory 112 of FIG. 1, such as the LD-HP memory 402 of FIG. 4) can be provided. The provided first die can have a first set of characteristics, such as a response time, a refresh rate, a ECC capacity, a refresh duration, a memory density, a power consumption level, etc. At block 704, a second die (e.g., the second memory 114 of FIG. 1, such as the HD-LP memory 404/406 of FIG. 4) can be provided. The provided second die can have a second set of characteristics that correspond to the first set of characteristics. The first and second sets of characteristics can be complementary to each other. For example, in comparison to the second die, the first die can be configured to provide faster response as described above. Also, in comparison to the first die and/or as a tradeoff for the response speed, the second die can be configured to have higher memory density (e.g., same storage capacity for smaller physical footprint), lower power consumption, less frequent refreshes, etc. In some embodiments, providing the first die and/or the second die can include manufacturing/forming the first die and/or the second die, such as according to semiconductor integrated-circuit manufacturing processes.

At block 706, a substrate (e.g., the substrate 302 of FIG. 3A or the substrate 312 of FIG. 3B) may be provided. Some examples of the provided substrate can include a PCB, a silicon substrate, a ceramic structure, a metallic structure etc. At block 708, the provided dies can be attached to the substrate. In some embodiments, the dies can be stacked on top of each other over the substrate. In other embodiments, the dies can be attached directly to the substrate and be separately from each other along one or more lateral directions.

At block 710, a common interface (e.g., the common interface 412 of FIG. 4) can be formed. For example, the common interface 412 can be formed by electrically connecting (via, e.g., wires, traces, wirebonds, solder, etc.) the data pads (e.g., DQ<N:0>) and/or the address pads (e.g., CA<M:0>) of the first and second dies together. The commonly tied or shared data/address connections and the CS pads can be electrically connected to the external connectors or pads, such as outwardly-exposed pads or connectors on the substrate.

In some embodiments, such as illustrated at block 712, the dies and/or the substrate can be encapsulated. For example, the encapsulant 304 of FIG. 3A, such as resin material, can be applied over the dies and the substrate and hardened, such as by using a known chemical reaction in the resin material and/or a catalyst, such as light, gas, and/or temperature variation.

FIG. 7B is a flow diagram illustrating an example method 750 of operating an apparatus (e.g., the apparatus 100 of FIG. 1 and/or FIG. 4) in accordance with an embodiment of the present technology. For example, the method 750 can be for performing memory operations (e.g., read and/or write operations) with the first memory 112 of FIG. 1 and the second memory 114 of FIG. 1. The method 750 can correspond to the first timing diagram 500 of FIG. 5. The method 750 can be performed by the apparatus controller 102 of FIG. 1, the system controller 104 of FIG. 1, and/or the apparatus 100.

At block 752, the apparatus controller 102 can receive an external command from a system controller 104. For example, the apparatus controller 102 can receive a read command or a write command. Additional information, such as write data and/or read/write address, can accompany the received command. At block 753, the apparatus controller 102 can receive the priority indication 108 of FIG. 1 accompanying the command.

At block 754, the apparatus controller 102 can command the memory apparatus (e.g., the apparatus 100) according to the received external command. For example, the apparatus controller 102 can send the PRE command, the ACT command, and the READ command for a read operation as described above. The apparatus controller 102 can also send additional information for the commanded operation, such as an address identifying a location within the apparatus 100 (e.g., identifiers for rank, bank, row, column, etc.). At block 755, the apparatus controller 102 can generate a CS signal for identifying a memory die within the apparatus 100 targeted for the command. The apparatus controller 102 can be configured to generate the CS signal according to the priority indication 108. For example, the apparatus controller 102 can generate the CS signal that selects either CS0 of FIG. 4 according to a look-up table that associates a set of predetermined values of the priority indication 108 (e.g., a set of more urgent or important QoS values) to the first memory 112 or the LD-HP memory 402. The apparatus controller 102 can generate CS1 of FIG. 4 for other values of the priority indication 108.

At block 756, the command from the apparatus controller 102 can be received at one the dies within the apparatus 100. For example, the commands and the addresses can be sent to all or multiple dies within the apparatus 100 through the common interface 412 of FIG. 4. The die targeted by the command can receive and begin processing the available command and address according to the CS signal. In other words, the die receiving the active CS signal can load the command and the address into an input buffer/latch.

At block 758, the receiving die can process the command. For example, the die indicated by the CS signal can perform the read operation or the write operation according to the received command and the address. For write commands, the die can store the accompanying data at a storage location indicated by the address. For read commands, the die can access the information stored at the location indicated by the address. To execute each operation, the apparatus controller 102 and the apparatus 100 can communicate and execute a corresponding series of actions (e.g., PRE, ACT, and READ for a read operation).

For read operations, such as illustrated at block 760, the commanded die can output the read result of the shared bus (e.g., the common interface 412). The apparatus controller 102 can receive the read data through the common interface 412. At block 762, the apparatus controller 102 can send the read data to the system controller 104 as a response to the external command.

Figure 8:
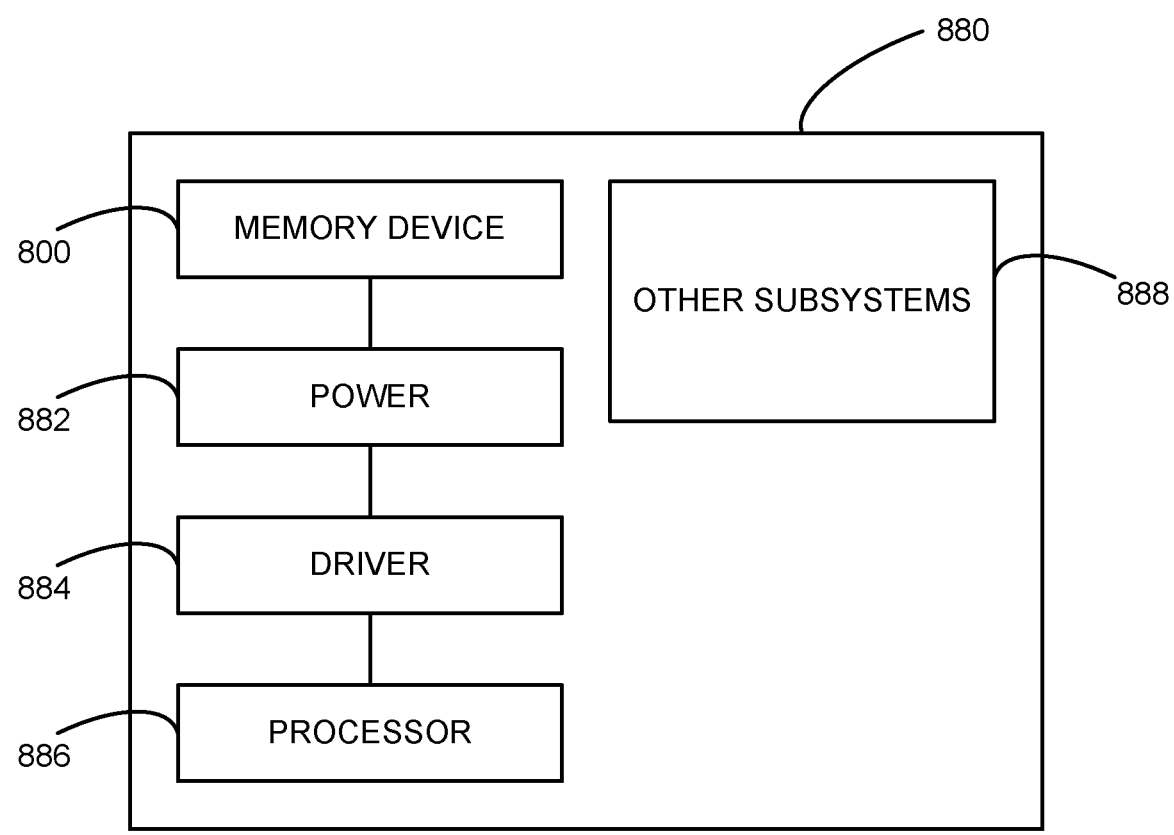
FIG. 8 is a schematic view of a system that includes an apparatus in accordance with an embodiment of the present technology.

FIG. 8 is a schematic view of a system that includes an apparatus in accordance with embodiments of the present technology. Any one of the foregoing apparatuses (e.g., memory devices) described above with reference to FIGS. 1-5 can be incorporated into any of a myriad of larger and/or more complex systems, a representative example of which is system 880 shown schematically in FIG. 8. The system 880 can include a memory device 800, a power source 882, a driver 884, a processor 886, and/or other subsystems or components 888. The memory device 800 can include features generally similar to those of the apparatus described above with reference to FIGS. 1-7, and can therefore include various features for performing a direct read request from a host device. The resulting system 880 can perform any of a wide variety of functions, such as memory storage, data processing, and/or other suitable functions. Accordingly, representative systems 880 can include, without limitation, hand-held devices (e.g., mobile phones, tablets, digital readers, and digital audio players), computers, vehicles, appliances and other products. Components of the system 880 may be housed in a single unit or distributed over multiple, interconnected units (e.g., through a communications network). The components of the system 880 can also include remote devices and any of a wide variety of computer readable media.

From the foregoing, it will be appreciated that specific embodiments of the technology have been described herein for purposes of illustration, but that various modifications may be made without deviating from the disclosure. In addition, certain aspects of the new technology described in the context of particular embodiments may also be combined or eliminated in other embodiments. Moreover, although advantages associated with certain embodiments of the new technology have been described in the context of those embodiments, other embodiments may also exhibit such advantages and not all embodiments need necessarily exhibit such advantages to fall within the scope of the technology. Accordingly, the disclosure and associated technology can encompass other embodiments not expressly shown or described herein.

In the illustrated embodiments above, the apparatuses have been described in the context of DRAM devices. Apparatuses configured in accordance with other embodiments of the present technology, however, can include other types of suitable storage media in addition to or in lieu of DRAM devices, such as, devices incorporating NAND-based or NOR-based non-volatile storage media (e.g., NAND flash), magnetic storage media, phase-change storage media, ferroelectric storage media, etc.

The term "processing" as used herein includes manipulating signals and data, such as writing or programming, reading, erasing, refreshing, adjusting or changing values, calculating results, executing instructions, assembling, transferring, and/or manipulating data structures. The term data structure includes information arranged as bits, words or code-words, blocks, files, input data, system-generated data, such as calculated or generated data, and program data. Further, the term "dynamic" as used herein describes processes, functions, actions or implementation occurring during operation, usage or deployment of a corresponding device, system or embodiment, and after or while running manufacturer's or third-party firmware. The dynamically occurring processes, functions, actions or implementations can occur after or subsequent to design, manufacture, and initial testing, setup or configuration.

The above embodiments are described in sufficient detail to enable those skilled in the art to make and use the embodiments. A person skilled in the relevant art, however, will understand that the technology may have additional embodiments and that the technology may be practiced without several of the details of the embodiments described above with reference to FIGS. 1-8.

What is claimed is:

1. An apparatus, comprising:
a first memory circuit having a first set of performance measures that include at least a first type and a second type, wherein the first memory circuit is configured to increase the first type of performance measure;
a second memory circuit having a second set of performance measures that include the first type and the second type, wherein the second memory circuit is configured to increase the second type of performance measure;

a shared interface connected to the first and second memory circuits, wherein the shared interface provides a common input, a common output, or both for the first and second memory circuits; and a selection interface configured to select between the first memory circuit and the second memory circuit to perform a memory operation.

2. The apparatus of claim 1, wherein:
the first and second memory circuits utilize different interface protocols and/or data storage technologies.

3. The apparatus of claim 1, wherein:
the first memory circuit comprises a first die;
the second memory circuit comprises a second die; and
the second type of performance measure is a memory density, wherein the memory density is greater for the second die than for the first die.

4. The apparatus of claim 1, wherein:
the first memory circuit comprises a first die;
the second memory circuit comprises a second die; and
the first type of performance measure is a maximum speed, wherein the maximum speed is greater for the first die than the second die.

5. The apparatus of claim 4, wherein the maximum speed is associated with a response time for reading data stored in a corresponding die, a frequency and/or a duration for refresh operations, an Error Correction Code (ECC) capacity, or a combination thereof.

6. The apparatus of claim 1, wherein:
the first memory circuit comprises a first die and includes a first set of address pads and a first set of contact pads;
the second memory circuit comprises a second die and includes a second set of address pads and a second set of contact pads; and
the shared interface includes:
  a shared data connection that connects the first and second sets of contact pads in parallel for communicating read and/or write data with a memory controller, and
  a shared address connection that connects the first and second sets of address pads in parallel for communicating storage addresses within the first and/or the second dies.

7. The apparatus of claim 6, wherein:
the first die includes a first Chip Select (CS) pad; and
the second die includes a second CS pad;
wherein the first and second CS pads comprise the selection interface, the first and second CS pads configured to receive separate CS signals used to select one of the first die and the second die for maximizing either the first type or the second type of performance measure.

8. The apparatus of claim 7, wherein the first and second CS pads are configured to receive the separate CS signals that correspond to a Quality of Service (QoS) indicator provided by the memory controller.

9. The apparatus of claim 1, further comprising a third die connected to the shared interface and connected with a second die associated with the second memory circuit, wherein the third die is configured to operate with the second die as a single storage unit to store and provide access to non-overlapping portions of a unit of data, the third die including:
a third memory circuit having third set of fifth performance measures that include the first and second types, wherein
  the third memory circuit is configured to increase the second type of the performance measure over that of the second memory circuit while the first memory circuit exceeds in the first type of performance over the third memory circuit.

10. The apparatus of claim 1, wherein:
the first memory circuit comprises a lower density-higher performance (LD-HP) memory die;
the second memory circuit is a higher density-lower performance (HD-LP) memory die; and
the shared interface is configured to simultaneously communicate a data word with both the LD-HP memory die and the HD-LP memory die.

11. A memory system, comprising:
a memory device including:
  a first memory chip having a first set of performance measures that include at least a first type and a second type;
  a second memory chip having a second set of performance measures that include the first and second types, wherein
    the second memory chip is configured to increase the second type of performance measure in comparison to the first memory chip, and
    the first memory chip is configured to increase the first type of performance measure in comparison to the second memory chip;
  a shared interface connecting the first and second memory chips, wherein the shared interface provides a common input, a common output, or both for the first and second memory chips; and
a memory controller electrically coupled to the shared interface of the memory device, the memory controller configured to:
  generate a Chip Select (CS) signal based on a Quality of Service (QoS) indicator provided by a host device, wherein the CS signal is for selecting either the first memory chip or the second memory chip to process a read operation or a write operation commanded by the host device.

12. The memory system of claim 11, wherein:
the first memory chip corresponds to a first response time;
the second memory chip corresponds to a second response time slower than the first response time; and
the memory controller is configured to schedule a first read operation for the first memory chip and a second read operation for the second memory chip based on the first and second response times, wherein—
  at least one overlapping portions of the first and second read operations are scheduled to be executed concurrently,
  the first and second read operations are scheduled to generate respective outputs at different times, and
  the outputs of the first and second read operations are communicated over the shared interface.

13. The memory system of claim 11, wherein:
the first type of performance measure is memory density and the second type of performance measure is response threshold for completing a commanded operation; and
the second memory chip includes memory has greater density and lower response time than the first memory chip.

14. The memory system of claim 13, wherein:
the first memory chip corresponds to a first power consumption level associated with a refresh operation, a read operation, a write operation, or a combination thereof; and the second memory chip corresponds to a second power consumption level associated with a refresh operation, a read operation, a write operation, or a combination thereof, wherein the second power consumption level is less than the first power consumption level.

15. The memory system of claim 11, wherein the memory device comprises a Dynamic Random Access Memory (DRAM) and the first and second memory chips are Low Power Double Data Rate 5 (LP DDR5) devices.

16. A method of operating a memory system, the method comprising:
- receiving a memory operation command for a memory device, wherein the memory device includes:
  - a first memory chip having a first set of performance measures that include at least a first type and a second type;
  - a second memory chip having a second set of performance measures that include at least the first and second types, wherein
    - the second memory chip has the second type of performance measure exceeding that of the first memory chip, and
    - the first memory chip has the first type of performance measure exceeding that of the second memory chip;
  - a shared interface connecting the first and second memory chips, wherein the shared interface provides a common input, a common output, or both for the first and second memory chips; and
- receiving a Quality of Service (QoS) indicator associated with the memory operation command; and
- selecting either the first memory chip or the second memory chip for performing a commanded memory operation, wherein the first memory chip or the second memory chip is selected based on a type of exceeding performance measure that matches the QoS indicator.

17. The method of claim 16, wherein:
- the memory operation command is received at a memory controller coupled to the memory device;
- selecting either the first or the second memory chip includes generating a chip select (CS) signal using the memory controller, wherein the CS signal is provided to the selected one of the first or the second memory chip for executing the memory operation command;
- further comprising:
- communicating data associated with the memory operation through the shared interface, wherein the communicated data is a read data or a write data simultaneously accessible to the memory controller, the first memory chip, and the second memory chip through a parallel connection.

18. The method of claim 16, wherein:
- the first memory chip is configured to store a first data set corresponding to a first set of addresses, the first memory chip including a first CS pad and a first set of address pads;
- the memory device further comprises a third memory chip configured to store a second data set corresponding to a second set of addresses, the third memory chip including a second CS pad and a second set of address pads, wherein
  - the second CS pad is directly connected to the first CS pad, and
  - the third memory chip is configured to emphasize the first type of performance measure over the second memory chip;
- the shared interface connects the first set of address pads and the second set of address pads in parallel;
- generating a CS signal includes selecting both the first memory chip and the third memory chip through the directly connected first and second CS pads; and
- further comprising:
- generating a memory address for selecting either the first memory chip or the third memory chip when the CS signal selects both the first memory chip and the third memory chip.

19. The method of claim 16, wherein:
- the first type of performance measure represents a maximum operating speed of a corresponding memory chip;
- the second type of performance measure represents a storage density of a corresponding memory chip; and
- selecting either the first memory chip or the second memory chip includes determining whether or not a higher maximum operating speed is required for the memory operation command to satisfy the QoS indicator.

20. The method of claim 19, wherein:
- selecting either the first memory chip or the second memory chip includes selecting the second memory chip to reduce power consumption associated with executing the memory operation command.

* * * * *